United States Patent [19]

Yamada et al.

[11] 4,355,090
[45] Oct. 19, 1982

[54] METHOD FOR MAKING A DIFFUSION TRANSFER LITHOGRAPHIC PRINTING PLATES WITH OXAZOLIDONES

[75] Inventors: Shoji Yamada; Eiji Kanada, both of Nagaokakyo; Kozo Haino, Kyoto, all of Japan

[73] Assignee: Mitsubishi Paper Mills, Ltd., Tokyo, Japan

[21] Appl. No.: 164,938

[22] Filed: Jul. 1, 1980

[30] Foreign Application Priority Data

Jul. 4, 1979 [JP] Japan .................................. 54/84744

[51] Int. Cl.³ .............................................. G03C 5/54
[52] U.S. Cl. .................................... 430/204; 430/234; 430/251; 430/455; 430/456
[58] Field of Search ............... 430/234, 249, 251, 265, 430/268, 455, 456, 614, 486, 302, 204

[56] References Cited

U.S. PATENT DOCUMENTS

| | | | |
|---|---|---|---|
| T880,001 | 2/1969 | Yudelson et al. | 430/372 |
| 3,060,028 | 10/1962 | Dersch | 430/446 |
| 3,385,701 | 5/1968 | Ormsbee | 430/204 |
| 3,776,728 | 12/1973 | Suzuki et al. | 430/251 |
| 3,904,412 | 9/1975 | Serrien et al. | 430/204 |

FOREIGN PATENT DOCUMENTS 922476 4/1960 United Kingdom ................ 430/204

*Primary Examiner*—John E. Kittle
*Assistant Examiner*—John L. Goodrow
*Attorney, Agent, or Firm*—Cushman, Darby & Cushman

[57] ABSTRACT

Method for making lithographic printing plates by silver salt diffusion transfer process is disclosed. That is, lithographic printing plates having excellent printing endurance are obtained by carrying out the diffusion transfer processing in the presence of a compound having the ring structure

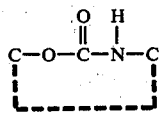

which may be present in at least one constitutive layer of the printing plate materials (photographic materials) used for making the printing plates or in the diffusion transfer processing solution.

8 Claims, No Drawings

METHOD FOR MAKING A DIFFUSION TRANSFER LITHOGRAPHIC PRINTING PLATES WITH OXAZOLIDONES

BACKGROUND OF THE INVENTION

This invention relates to a silver halide photographic material for the production of lithographic printing plates by the silver salt diffusion transfer process, diffusion transfer processing solution and a method for making the printing plates.

Lithographic printing plates consists of greasy ink receptive oleophilic image portions and ink repellent oleophobic non-image portions, the latter being generally water receptive hydrophilic areas.

Therefore, the ordinary lithographic printing is carried out by feeding both water and ink to the surface of printing plates to allow the image portions to receive preferentially the ink and the non-image portions to receive preferentially water and then transferring the ink on the image portions onto a substrate such as paper.

Thus, in order to obtain prints of good quality, it is necessary that the difference between oleophilicity of the surface of image portions and hydrophilicity of the surface of non-image portions is sufficiently large so that when water and ink are applied the image portions can receive sufficient amount of ink while the non-image portions may completely repel the ink.

Defects of lithographic printing plates made by silver salt diffusion transfer process (DTR process) are as follows. The printing plates are poor in resistance against mechanical abrasion and ink receptivity of hydrophobic areas which carry ink images is gradually lost to result in decrease of printing endurance. Furthermore, the hydrophilic areas are gradually rendered hydrophobic and so the non-image areas, namely, background areas are apt to be stained with ink. Moreover, the hydrophobic image areas become unable to receive uniformly the greasy ink to cause unevenness of ink receptivity of the image areas.

There have already been printing plates in actual use which are produced by providing metallic silver patterns on the plates by DTR process which are rendered ink-receptive. See, for example, U.S. Pat. Nos. 3,220,837 and 3,721,559, Japanese Patent Examined Publications (KOKOKU) No. 16725/73 and No. 30562/73 and Japanese Patent Unexamined Publications (KOKAI) No. 4482/71 and No. 21603/78. However, these printing plates have still the defects as enumerated above.

Like other lithographic printing plates, lithographic printing plates obtained by applying the DTR process are also required to be increased in their printing endurance by selecting construction of plate materials, composition of processing solutions, printing conditions, etc., but the effect which the state of transfer-developed silver particles give on printing characteristics of printing plates is a big factor for increasing the printing endurance. In order that the silver particles transfer-developed by the DTR process may have higher printing endurance, conditions for formation of transfer silver particles, such as diffusion speed of silver complex, stability and reducing rate and size and shape of the formed silver particles are important factors although construction of lithographic printing plates has some influence thereon.

A great number of compounds are known as silver complex forming agents used for DTR process. For making lithographic printing plates by applying DTR process, thiosulfates and thiocyanates have been considered most preferred and actually used from the economical point of view and the point of printing endurance of said transfer-developed silver particles. However, even these silver complex forming agents cannot provide lithographic printing plates having satisfactory printing endurance.

SUMMARY OF THE INVENTION

Objects of this invention are to provide a method for making, by silver salt diffusion transfer process, lithographic printing plates which have image areas of transfer silver having excellent ink receptivity and non-image areas with no stains and which have such improved printing endurance that said characteristics can be maintained even after printing of a great number of copies, namely, the lithographic printing plates can stand printing of a great number of copies keeping excellent ink receptivity of image areas and stainlessness of non-image areas and photographic materials and processing solutions used for making same.

DESCRIPTION OF THE INVENTION

The inventors have found that said objects can be attained by carrying out the diffusion transfer development in the presence of a compound having the structure represented by the formula

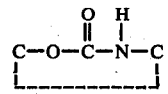

in making lithographic printing plates by silver salt diffusion transfer process.

That is, a compound represented by the above formula is allowed to exist in constitutive layers of photographic materials (lithographic printing plate materials) and/or DTR developing solutions used for making lithographic printing plates by DTR process. Preferred compounds are represented by the following general formula:

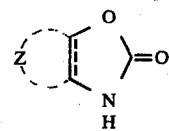

(wherein Z represents a condensed benzene ring or a condensed naphthalene ring which may or may not be present and optional substituent(s) may be present in said condensed ring or at 4- and/or 5-positions of the 5-membered ring when the condensed ring is not present). Examples of these substituents are alkyl groups (preferably of $C_{1-5}$), alkoxy groups (preferably of $C_{1-5}$), halogen atoms, nitro group, hydroxyalkyl groups (preferably of $C_{1-5}$), aryl groups, aralkyl groups, alkylcarbonyl groups (preferably of $C_{1-5}$), alkoxycarbonyl groups (preferably of $C_{1-5}$), acyl groups, sulfamoyl group, carbamoyl group, carboxyl group, sulfo group, hydroxyl group, heterocyclic groups, etc. What is important in said general formula is that it contains the 5-membered ring structure represented by $$\begin{array}{c} \text{O} \quad \text{H} \\ \text{C} - \text{O} - \overset{\|}{\text{C}} - \text{N} - \text{C} \\ \text{-----------} \end{array}$$

Examples of the compounds are as follows:

Compound (1): 2-oxazolidinone (unsubstituted)

Compound (2): 4,4-diethyl-2-oxazolidinone

Compound (3): 4-methyl-4-hydroxymethyl-2-oxazolidinone

Compound (4): 4-methyl-2-oxazolidinone

Compound (5): 4-oxazolin-2-one

Compound (6): 4,4-bis(hydroxymethyl)-2-oxazolidinone

Compound (7): 4-ethyl-2-oxazolidinone

Compound (8): 4-chloro-4-oxazolin-2-one

Compound (9): 4-methyl-5-phenyl-2-oxazolidinone

Compound (10): naphtho-fused oxazolidinone

Compound (11): 5-methylbenzoxazol-2(3H)-one

Compound (12): benzoxazol-2(3H)-one

Compound (13): 6-methylbenzoxazol-2(3H)-one

Compound (14): 5-methoxycarbonylbenzoxazol-2(3H)-one

Compound (15): 5-chlorobenzoxazol-2(3H)-one

Compound (16): 5-carboxybenzoxazol-2(3H)-one

Compound (17): 5-sulfamoylbenzoxazol-2(3H)-one

Compound (18): 5-(phenylsulfamoyl)benzoxazol-2(3H)-one

Compound (19): 5-(morpholinosulfonyl)benzoxazol-2(3H)-one

Compound (20): 5-(sodiosulfo)benzoxazol-2(3H)-one

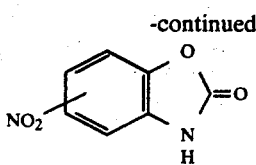

Compound (21)

These compounds and method for preparation thereof are known in U.S. Pat. No. 2,399,118 or "Justus Liebigs Ann. chem." 1976 (7-8) 1319-22 or they may be synthesized by applying said method. Some of them are commercially available.

When said compound is incorporated into constitutive layer of printing plate materials (silver halide photographic materials), the compound dissolved in water or a water miscible organic solvent is added in an amount of about 0.001 g/m²–about 1 g/m². When it is contained in DTR processing solutions, the amount is about 0.1 g/l–about 50 g/l. These amounts are not critical and may be varied to some degree depending on various conditions. When the compound is contained in the constitutive layers of the printing plate materials, it may be contained in at least one of physical developing nuclei layer, silver halide emulsion layer and other layers.

The following compounds (22) and (23), for examples, are not included in the general formula mentioned hereinbefore, but they release —COCH₃ group in an alkali developing solution to become compounds of said general formula. Therefore, —NH— in the general formula should be interpreted to also include that which is substituted with a group which can be released in an alkali developing solution.

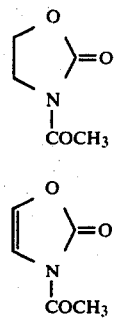

Compound (22)

Compound (23)

According to preferred embodiments of this invention, when the DTR development is carried out in the coexistence of silver halide solvents (other than the compounds of said general formula), e.g., thiosulfates, thiocyanates, mercapto compounds, amines (e.g., alkanol amines, etc.) with the compounds of said general formula, there are obtained better results than the best results obtained with each of said solvents alone. These better results are obtained using much smaller amounts of the silver halide solvent (other than the compounds of said general formula) than that when they are used alone. This is a preferred embodiment and the object of this invention can be fully attained with use of only the compounds of said general formula. It has been found that compounds of said general formula having sulfamoyl group (which may be substituted) provide especially superior effect.

This invention may be applied to any of lithographic printing plates to be produced by known DTR development. One preferred embodiment comprises lithographic printing plates comprising a support on which antihalation layer, silver halide emulsion layer and physical development nuclei layer are laminated in this order.

The silver halide emulsion for use in this invention can be any of the photographic emulsions such as those of chloride, bromide, chlorobromide, chloroiodide, bromoiodide, and chlorobromoiodide of silver and the most preferred is that containing at least about 50 mol% of silver chloride. Size, crystal habit and distribution of the silver halide grains are not limitative. Moreover, the silver halide emulsions can be prepared by any methods usually known in the photographic field. The silver halide emulsions may be chemically sensitized by well-known methods and also may be spectral-sensitized for blue, green and red. Antifoggants, stabilizers, developing agents, harneners, matting agents (graining agents) may also be added. Preferred binder for the silver halide emulsion is gelatin, a part or whole of which may be substituted with other natural and/or synthetic hydrophilic colloid such as albumin, casein, polyvinyl alcohol, sodium alginate, sodium salt of carboxymethylcellulose, etc.

Weight ratio of the hydrophilic colloid to silver halide in terms of silver nitrate is generally 5–0.3, preferably 2–0.5.

Amount of silver halide coated on a support is about 0.2–about 5 g/m², preferably 0.5–3 g/m² in terms of silver nitrate.

Undercoat layers may be provided under the silver halide emulsion layers (and above the support) for purposes of antihalation. As the support may be used any conventional supports for photographic materials such as paper, glass, films such as cellulose acetate film, polyvinyl acetal film, polystyrene film, polypropylene film, polyethylene terephthalate film, composite films such as polyester, polypropylene, polystyrene films covered with polyethylene films, metals, metallized papers or metal/paper laminates. Papers one or both surfaces of which are coated with an α-olefin polymer such as polyethylene are also effective. These supports may contain antihalation dyes or pigments. If necessary, a thin layer of water-permeable binders such as methylcellulose, sodium salt of carboxymethylcellulose, hydroxyethylcellulose, hydroxyethyl starch, sodium alginate, polyvinyl alcohol, polyvinylpyrrolidone may be provided as an uppermost layer on the emulsion coated side of the support.

In practice of the DTR process the developer may be incorporated into silver halide emulsion layer and/or image receiving layer or other water-permeable layers adjacent thereto as disclosed in British Pat. Nos. 1,000,115, 1,012,476, 1,017,273, 1,042,477, etc. Therefore, in this case, as the processing solution used at developing stage the so-called "alkaline activating solution" containing no developer may be used. PH value of the solutions is preferably at least about 10.

The physical development nuclei layer, namely, an image receiving layer which is preferably adjacent to the silver halide emulsion layer may be provided above or under the silver halide emulsion layer, but preferably it is provided above it (i.e., not between the support and the emulsion layer).

Suitable physical development nuclei used in this invention are metals such as antimony, bismuth, cadmium, cobalt, palladium, nickel, silver, lead, zinc, etc. and their sulfides. The image receiving layer may not contain hydrophilic colloid, but may contain hydrophilic colloids such as gelatin, carboxymethylcellulose, gum arabic, sodium alginate, hydroxyethyl starch, dextrin, hydroxyethylcellulose, polystyrenesulfonic acid, vinylimidazole-acrylamide copolymer, polyvinyl alcohol, etc.

The image receiving layer may contain wetting agents such as hygroscopic materials, e.g., sorbitol, glycerol, etc. The image receiving layer may further contain pigments for preventing scumming such as barium sulfate, titanium dioxide, china clay, silver, etc., developing agents such as hydroquinone and hardeners such as formaldehyde.

The DTR processing solution used in this invention may contain alkaline materials such as sodium hydroxide, potassium hydroxide, lithium hydroxide, trisodium phosphate, etc., thickeners such as hydroxyethylcellulose, carboxymethylcellulose, etc., anti-foggants such as potassium bromide, 1-phenyl-5-mercaptoterazole, etc., developers such as hydroquinone, 1-phenyl-3-pyrazolidone, etc., development modifiers such as polyoxyalkylene compounds, onium compounds, etc.

The lithographic printing plates according to this invention may be made ink-receptive or ink-receptivity may be increased with compounds as disclosed in Japanese Patent Examined Publication (KOKOKU) No. 29723/73 and U.S. Pat. No. 3,721,559.

The conventional printing method, etch solutions, damping solutions, etc. may be used for carrying out printing with the lithographic printing plates of this invention.

The following nonlimiting examples further illustrate this invention.

EXAMPLE 1

A matting layer containing silica particles of $5\mu$ in average particle size was provided on one surface of a both surfaces polyethylene coated paper of 135 g/m². On another surface of said paper which had been subjected to corona discharge treatment was provided an antihalation layer containing carbon black and then on this layer was coated an orthochromatically sensitized high speed silver chlorobromide emulsion (containing 95 mol% of silver chloride) containing silica particles of $5\mu$ in average particle size at a coating amount of 2.0 g/m² in terms of silver nitrate. These antihalation layer and emulsion layer contained formalin as a hardener. After drying, this material was left for 3 days at 40° C. and then on said emulsion layer was coated a palladium sulfide sol prepared by the following process at a rate of 5 m/min.

| Preparation of the palladium sulfide sol | | | |
|---|---|---|---|
| Liquid A | Palladium chloride | 5 g | |
| | Hydrochloric acid | 40 ml | |
| | Water | 1 l | |
| Liquid B | Sodium sulfide | 8.6 g | |
| | Water | 1 l | |

Liquid A and liquid B were mixed with stirring. After 30 minutes, the resultant mixture was purified by passing it through a column packed with ion-exchange resin made for preparation of pure water and then the following liquid C was added thereto to obtain a coating liquid.

| Liquid C | Methylvinyl ether/maleic anhydride Copolymer (1.25%) | 100 ml |
|---|---|---|
| | 10% aqueous solution of saponin | 200 ml |
| | Water | 1.8 l |

Thus obtained lithographic printing plate material (silver halide photographic material) was exposed imagewise in a camera for letterpress having an image reverse mechanism and was developed with the following silver salt diffusion transfer developing solution A at 30° C. for one minute.

| Transfer developing solution A | |
|---|---|
| Water | 750 ml |
| Sodium hydroxide | 10 g |
| Anhydrous sodium sulfite | 50 g |
| Hydroquinone | 6 g |
| Phenidone | 0.5 g |
| Sodium thiosulfate (5H$_2$O) | 5 g |
| Water to make 1 l | |

To this diffusion transfer developing solution A was added 70 millimols of each of compounds (1), (3), (4), (6), (7), (10), (11), (12), (14), (15), (16) and (22) exemplified hereinbefore to obtain developing solutions B–M. Lithographic printing plate materials produced and exposed in the same manner as mentioned above were processed with each of these developing solutions B–M.

Thereafter, these lithographic printing plate materials were passed between two squeezing rollers to remove excess developing solution and immediately thereafter were treated with a neutralizing solution having the following composition at 25° C. for 20 seconds. Then, excess solution was removed by squeezing rollers and the materials were dried at room temperature.

| Neutralizing solution | |
|---|---|
| Water | 600 ml |
| Citric acid | 10 g |
| Sodium citrate | 35 g |
| Colloidal silica (20% liquid) | 5 ml |
| Ethylene glycol | 5 ml |
| Water to make 1 l | |

Thus produced lithographic printing plates were mounted on an offset printing machine, the following etch solution was applied all over the plate surface and printing was carried out using the following damping solution.

| Etch solution | |
|---|---|
| Water | 600 ml |
| Isopropyl alcohol | 400 ml |
| Ethylene glycol | 50 g |
| 3-Mercapto-4-acetamide-5-n-heptyl-1,2,4-triazole | 1 g |

| Damping solution | |
|---|---|
| o-Phosphoric acid | 10 g |
| Nickel nitrate | 5 g |
| Sodium sulfite | 5 g |
| Ethylene glycol | 100 g |
| Colloidal silica (20% liquid) | 28 g |
| Water to make 2 l | |

The printing plates obtained using the developing solutions B–M had much superior printing endurance to that of the printing plate obtained using the developing solution A.

EXAMPLE 2

Lithographic printing plates were produced in the same manner as Example 1 except that 1.0 g/m² of hydroquinone and 0.5 g/m² of 1-phenyl-3-pyrazolidone were incorporated into the silver halide emulsion layer of Example 1 and these printing plates were processed with the following developing solution in the same manner as in Example 1.

| Transfer developing solution P | |
|---|---|
| Water | 800 ml |
| Trisodium phosphate | 75 g |
| Anhydrous sodium sulfite | 50 g |
| Potassium bromide | 0.5 g |
| Sodium thiosulfate | 15 g |
| Water to make 1 l | |

The thiosulfate in said developing solution P was replaced with 100 millimols of each of compounds (17) and (19) exemplified hereinbefore to obtain developing solutions Q and R. Printing plates were produced using these developing solutions in the same manner as mentioned above in this example.

Printing plates obtained using the developing solutions Q and R had printing endurance much superior to that of the printing plate obtained using the developing solution P.

EXAMPLE 3

Example 2 was repeated except that the following developing solution was used.

| | |
|---|---|
| K₃PO₄ | 60 g |
| Anhydrous sodium sulfite | 80 g |
| Thiosalicylic acid | 10 millimols |
| 3-amino-1-propanol | 20 ml |
| Compound exemplified before* | 50 millimols |

*Each of exemplified compounds (1), (10), (12), (17), (18) and (19) was used.

Thus obtained printing plates had all excellent printing endurance.

EXAMPLE 4

Lithographic printing plate materials were produced in the same manner as in Example 2 except that 0.5 g/m² of each of the exemplified compounds used in Examples 1 and 2 was contained in the image receiving layer in Example 2. Therefrom lithographic printing plates were produced using the following developing solution.

| Diffusion transfer developing solution | |
|---|---|
| Trisodium phosphate | 75 g |
| Anhydrous sodium sulfite | 50 g |
| Potassium bromide | 0.5 g |
| 2-amino-2-methyl-1-propanol | 10 g |
| Water to make 1 l | |

Thus obtained lithographic printing plates had excellent printing endurance and a great number of good print copies could be obtained.

What is claimed is:

1. Method for making a lithographic printing plate by the silver salt diffusion transfer development process after exposure of the plate, characterized in that the diffusion transfer development processing is carried out in the presence of a compound having the ring structure of the formula:

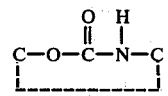

2. Method for making a lithographic printing plate according to claim 1, wherein the compound has the following general formula:

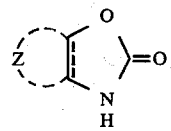

(wherein Z represents a condensed benzene or naphthalene ring which may or may not be present and these condensed rings when present may have substituent(s) and the 5-membered ring may have substituent(s) at 4- and/or 5-positions when the condensed ring is not present).

3. Method for making a lithographic printing plate according to claim 1 or 2, wherein the compound is present in at least one constitutive layer of printing plate material.

4. Method for making a lithographic printing plate according to claim 1 or 2, wherein the compound is present in diffusion transfer processing solution.

5. Method for making a lithographic printing plate according to claim 3, wherein the amount of the compound is about 0.001 g/m²–about 1 g/m².

6. Method for making a lithographic printing plate, according to claim 4, wherein the amount of the compound is about 0.1 g/l–about 50 g/l.

7. Diffusion transfer processing solution useful for making lithographic printing plate which contains the compound as defined in claim 1.

8. Lithographic printing plate material having a silver halide emulsion layer and an image receiving layer used for making lithographic printing plate which contains the compound as defined in claim 1 in at least one constitutive layer thereof.

* * * * *